(12) United States Patent
Lee et al.

(10) Patent No.: US 11,889,637 B2
(45) Date of Patent: Jan. 30, 2024

(54) DISPLAY SYSTEM, DISPLAY DEVICE AND DISPLAY CONNECTION MODULE THEREOF

(71) Applicant: Wistron Corp., New Taipei (TW)

(72) Inventors: An-Hsiu Lee, New Taipei (TW); Chih-Ping Chen, New Taipei (TW); Yuan-Tai Chen, New Taipei (TW); Chun-Hong Kuo, New Taipei (TW)

(73) Assignee: WISTRON CORP., New Taipei (TW)

( * ) Notice: Subject to any disclaimer, the term of this patent is extended or adjusted under 35 U.S.C. 154(b) by 65 days.

(21) Appl. No.: 17/719,773

(22) Filed: Apr. 13, 2022

(65) Prior Publication Data

US 2023/0072830 A1   Mar. 9, 2023

Related U.S. Application Data

(60) Provisional application No. 63/241,570, filed on Sep. 8, 2021, provisional application No. 63/241,079, filed on Sep. 6, 2021.

(30) Foreign Application Priority Data

Jan. 5, 2022   (TW) .................................. 111100382

(51) Int. Cl.
*H05K 5/00* (2006.01)
*H05K 5/02* (2006.01)

(52) U.S. Cl.
CPC ......... *H05K 5/0021* (2013.01); *H05K 5/0017* (2013.01); *H05K 5/0221* (2013.01)

(58) Field of Classification Search
CPC ... H05K 5/0021; H05K 5/0017; H05K 5/0221

(Continued)

(56) References Cited

U.S. PATENT DOCUMENTS

| 2020/0064677 | A1* | 2/2020 | Yoon ..................... G09F 9/3026 |
| 2020/0166966 | A1 | 5/2020 | Lee et al. |
| 2020/0201590 | A1 | 6/2020 | Lim |

FOREIGN PATENT DOCUMENTS

| CN | 103021284 A | 4/2013 |
| CN | 103544898 A | 1/2014 |

(Continued)

OTHER PUBLICATIONS

Extended European Search Report dated Dec. 14, 2022, issued in application No. EP 22180451.1.

(Continued)

*Primary Examiner* — Hung S. Bui
(74) *Attorney, Agent, or Firm* — McClure, Qualey & Rodack, LLP

(57) ABSTRACT

A display device is provided. The display device includes a device housing, a knob, a restriction unit and a screen panel. The knob is rotatably connected to the device housing, wherein the knob comprises a latch and a plurality of teeth, the knob is adapted to be rotated between a first knob location and a second knob location, and when the knob is in the first knob location, the latch protrudes from the device housing, and when the knob is in the second knob location, the latch is received in the device housing. The restriction unit is disposed in the device housing, wherein the restriction unit is adapted to be connected to one of the teeth to restrict the knob. The screen panel is detachably connected to the device housing. The display device can be easily detached from a display system.

19 Claims, 16 Drawing Sheets

(58) Field of Classification Search
USPC .................. 361/732, 728, 730, 801, 803
See application file for complete search history.

(56) References Cited

FOREIGN PATENT DOCUMENTS

| | | |
|---|---|---|
| CN | 103671378 A | 3/2014 |
| CN | 203982709 U | 12/2014 |
| CN | 104902716 A | 9/2015 |
| CN | 107195254 A | 9/2017 |
| CN | 108986679 A | 12/2018 |
| CN | 211062392 U | 7/2020 |
| CN | 113168791 A | 7/2021 |
| JP | 2015-210429 A | 11/2015 |
| WO | 2017/123528 A1 | 7/2017 |

OTHER PUBLICATIONS

Japanese language office action dated Jul. 4, 2023, issued in application No. JP 2022-102895.
English language translation of office action dated Jul. 4, 2023.
Chinese language office action dated Oct. 19, 2022, issued in application No. TW 111100382.

\* cited by examiner

DISPLAY SYSTEM, DISPLAY DEVICE AND DISPLAY CONNECTION MODULE THEREOF

CROSS REFERENCE TO RELATED APPLICATIONS

This application claims the benefit of U.S. Provisional Application No. 63/241,079, filed on Sep. 6, 2021, and U.S. Provisional Application No. 63/241,570, filed on Sep. 8, 2021, and claims priority of Taiwan Patent Application No. 111100382, filed on Jan. 5, 2022, the entirety of which are incorporated by reference herein.

BACKGROUND OF THE INVENTION

Field of the Invention

The present invention relates to a display device, and in particular to a display device of a display system which includes a plurality of display devices.

Description of the Related Art

Conventionally, a display system may include a plurality of display devices arranged in a matrix. Such a display system may be utilized to display huge images. The display devices are connected to each other with latches or bolts. However, connecting the display devices using latches or bolts requires time and effort, and the costs of mounting and maintaining them are thus increased. For example, when one display device in the center portion of the display system is damaged, the non-damaged display devices in the same column or the same row must all be removed just to repair the single damaged display device. The repair process is complex.

BRIEF SUMMARY OF THE INVENTION

Embodiments of the invention are provided to address the aforementioned difficulty.

In one embodiment, a display device is provided. The display device includes a device housing, a knob, a restriction unit and a screen panel. The knob is rotatably connected to the device housing, wherein the knob comprises a latch and a plurality of teeth, the knob is adapted to be rotated between a first knob location and a second knob location, and when the knob is in the first knob location, the latch protrudes from the device housing, and when the knob is in the second knob location, the latch is received in the device housing. The restriction unit is disposed in the device housing, wherein the restriction unit is adapted to be connected to one of the teeth to restrict the knob. The screen panel is detachably connected to the device housing.

In one embodiment, the teeth are ratchet teeth.

In one embodiment, the restriction unit comprises a restriction block and a spring, one end of the spring abuts the device housing, the other end of the spring abuts the restriction block, the restriction block is adapted to be moved between a first block position and a second block position, and when the restriction block is in the first block position, the restriction block is wedged against at least one of the teeth, and when the restriction block is in the second block position, the restriction block releases the knob.

In one embodiment, the display device further comprises a first connector, wherein the first connector is slidably connected to the device housing, the first connector is adapted to be moved between a first connector position and a second connector position, and when the first connector is in the first connector position, the first connector protrudes from the device housing, and when the first connector is in the second connector position, the first connector is received in the device housing.

In one embodiment, the display device further comprises a locking member and a cover piece, wherein the cover piece is connected to the device housing, the locking member pivots on the first connecter, and in a first locking state, the locking member is connected to the cover piece to restrict the movement of the first connector relative to the device housing.

In one embodiment, the cover piece comprises a first slot and a second slot, and when the first connector is in the first connector position, the locking member is adapted to be connected to the first slot, and when the first connector is in the second connector position, the locking member is adapted to be connected to the second slot.

In one embodiment, the display device further comprises a hook and two bolts, wherein the hook comprises a holding portion, the device comprises a first L-shaped groove and two second L-shaped grooves, the bolts pass through the second L-shaped grooves to connect the hook to the device housing, and the holding portion passes through the first L-shaped groove.

In one embodiment, in an affixed state, the bolts affix the position of the hook relative to the device housing, and in a released state, the bolts are adapted to be moved along the second L-shaped grooves, and the holding portion is adapted to be moved along the first L-shaped groove.

In one embodiment, the display device further comprises a plurality of panel magnets and a plurality of connection magnets, wherein the panel magnets are disposed on the screen panel, the connection magnets are disposed on the device housing, the panel magnets are adapted to be attracted by the connection magnets, and the screen panel is detachably connected to the device housing.

In one embodiment, the display device further comprises a plurality of fine-tuning screws, wherein the device housing further comprises a plurality of screw holders, the fine-tuning screws are connected to the screw holders, the connection magnets are disposed on the fine-tuning screws, and the position of the connection magnets relative to the device housing can be modified by rotating the fine-tuning screws.

In one embodiment, the screen panel comprises at least one panel buckling portion, the device housing comprises at least one housing buckling portion, and in an unexpected state, the housing buckling portion is adapted to connect to the panel buckling portion to support the screen panel.

In one embodiment, the display device further comprises a riser card and a second connector, wherein the riser card is slidably connected to the device housing, the second connector is disposed on the riser card, and the second connector is adapted to be connected to the screen panel.

In another embodiment, a display system is provided. The display system includes at least one bracket and a plurality of display devices. The display devices are hung on the bracket. Each display device comprises a device housing, a knob, a restriction unit and a screen panel. The knob is rotatably connected to the device housing, wherein the knob comprises a latch and a plurality of teeth, the knob is adapted to be rotated between a first knob location and a second knob location, and when the knob is in the first knob location, the latch protrudes from the device housing, and when the knob is in the second knob location, the latch is received in the device housing. The restriction unit is disposed in the device housing, wherein the restriction unit is adapted to be connected to one of the teeth to restrict the knob. The screen panel is detachably connected to the device housing. The knob is adapted to connect the adjacent two display devices.

In further another embodiment, a display connection module is provided. The display connection module includes a device housing, a knob and a restriction unit. The knob is rotatably connected to the device housing, wherein the knob comprises a latch and a plurality of teeth, the knob is adapted to be rotated between a first knob location and a second knob location, and when the knob is in the first knob location, the latch protrudes from the device housing, and when the knob is in the second knob location, the latch is received in the device housing. The restriction unit is disposed in the device housing, wherein the restriction unit is adapted to be connected to one of the teeth to restrict the knob.

Utilizing the display device of the embodiment of the invention, when one of the display devices of the display system is damaged, the maintainer can detach the damaged display device through the following steps. First, the screen panel is removed from the device housing. Then, the bolts on the hook are released. The hook is pushed to be separated from the bracket. Next, the first connector is pushed to the second connector position, and the knob is rotated to the second knob location. Finally, the device housing can be detached directly. Compared to the conventional art, the display devices of the embodiment of the invention can be easily assembled and disassembled. Particularly, when the damaged display device is located in the center portion of the display system, the damaged display device can be detached without removing the non-damaged display devices in the same column or the same row. The maintenance procedure is simplified. Additionally, the knob can tightly and seamlessly connect the two adjacent display devices.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
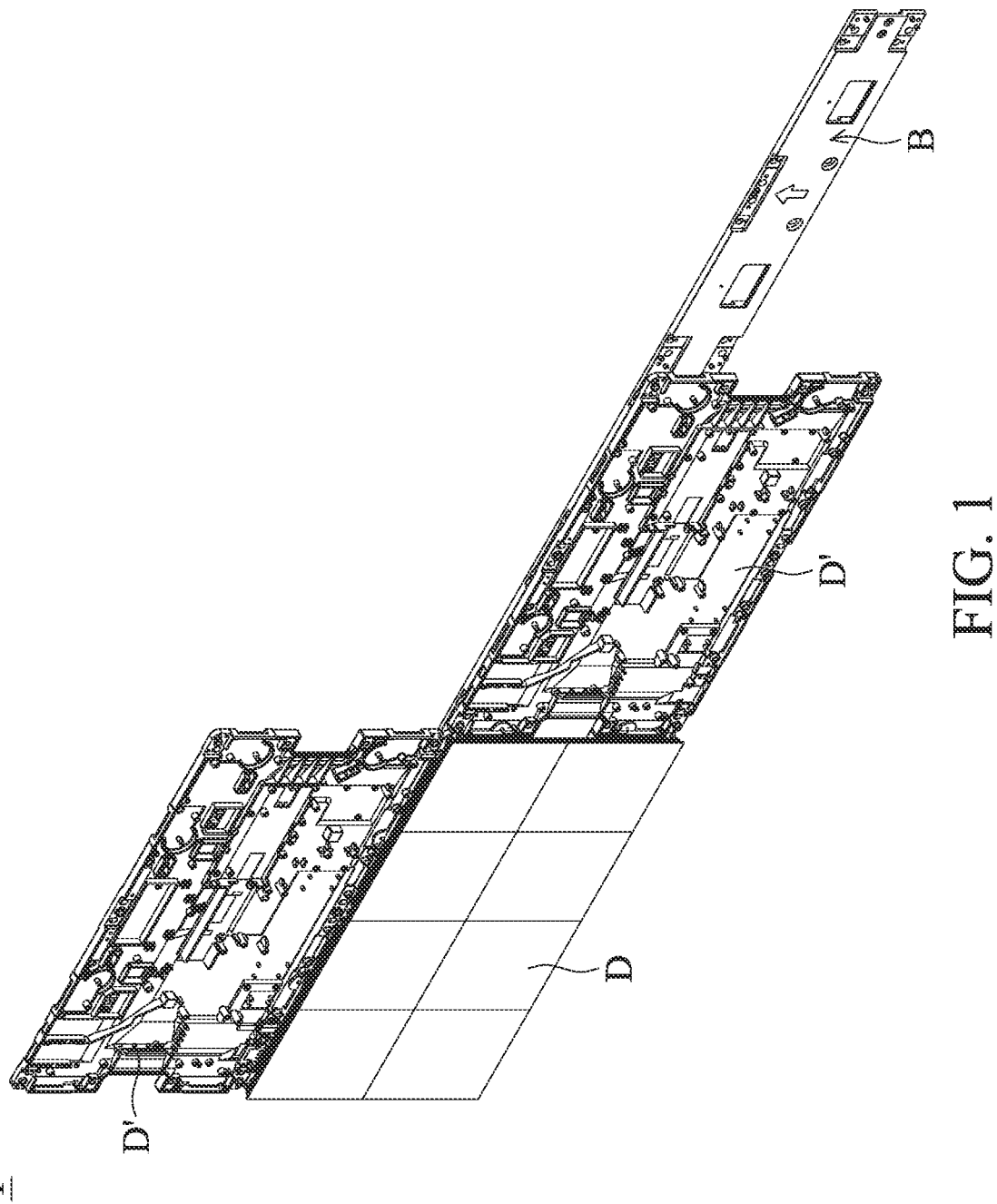
FIG. 1 shows a display system of an embodiment of the invention.

FIG. 1 shows a display system of an embodiment of the invention. With reference to FIG. 1, the display system T of the embodiment of the invention includes a plurality of display devices (D, D'). The display devices (D, D') can be electrically connected to each other to provide a large-size image. The display devices (D, D') are hung on a bracket B. In FIG. 1, the display device D is completely presented, and a portion of the elements (for example, screen panel) of the display device D' is omitted.

Figure 2:
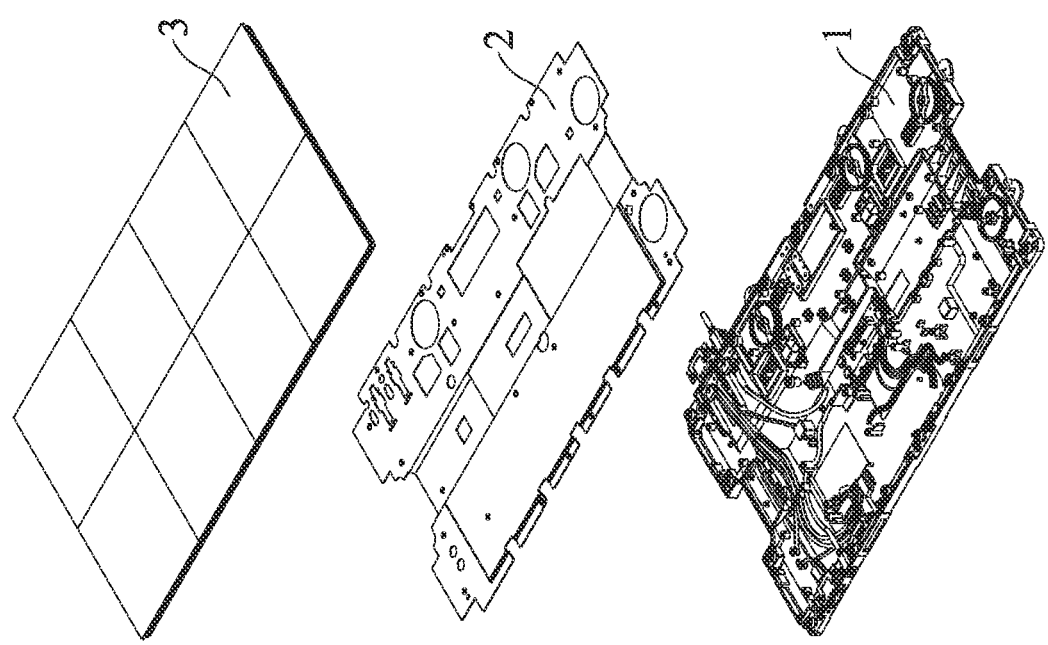
FIG. 2 is an exploded view of the display device of the embodiment of the invention.

FIG. 2 is an exploded view of the display device of the embodiment of the invention. With reference to FIG. 2, the display device D of the embodiment of the invention includes a device housing 1, a cover piece 2 and a screen panel 3. The cover piece 2 is connected to the device housing 1. The screen panel 3 is disposed on the cover piece 2.

Figure 3A:
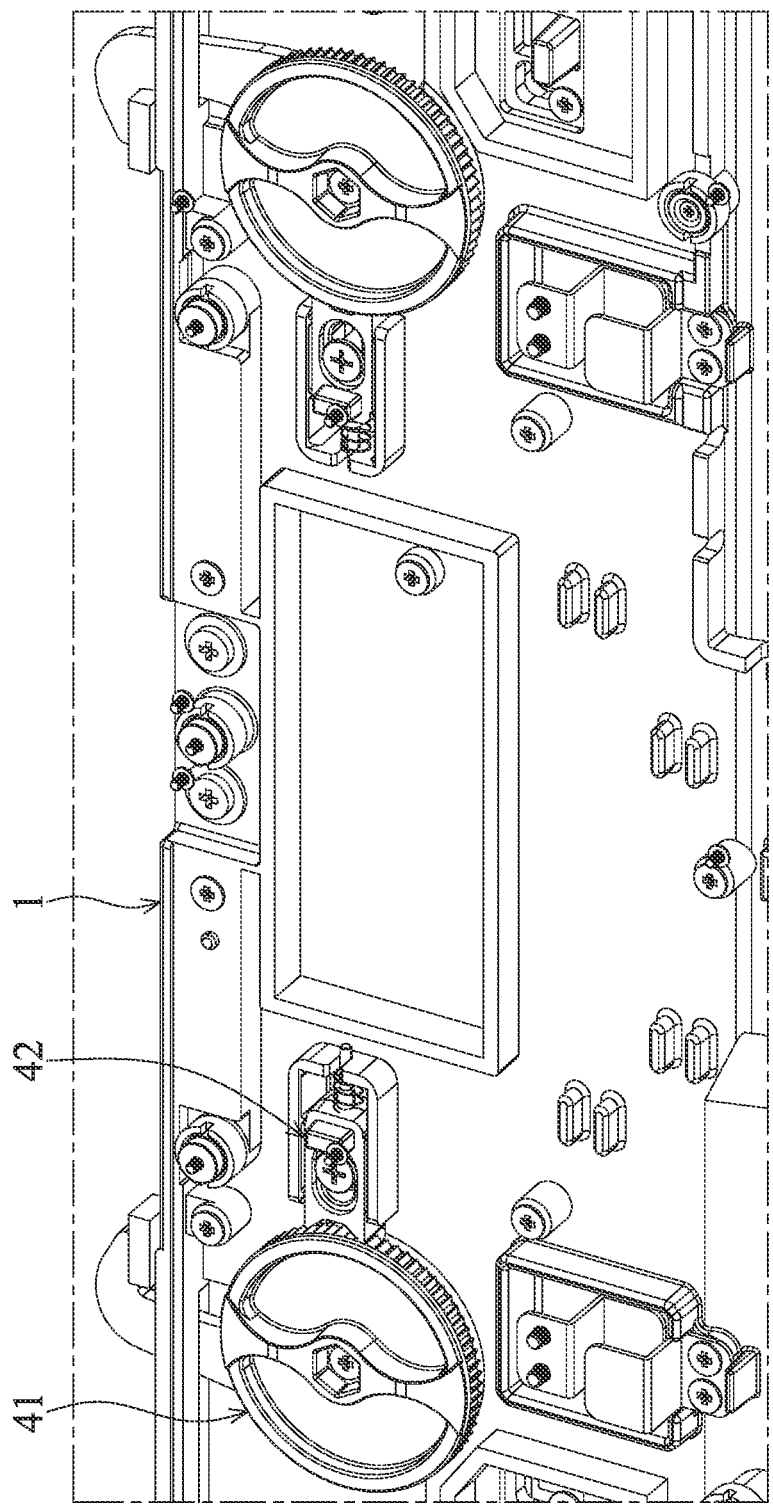
FIG. 3A shows a knob of the embodiment of the invention.
Figure 3B:
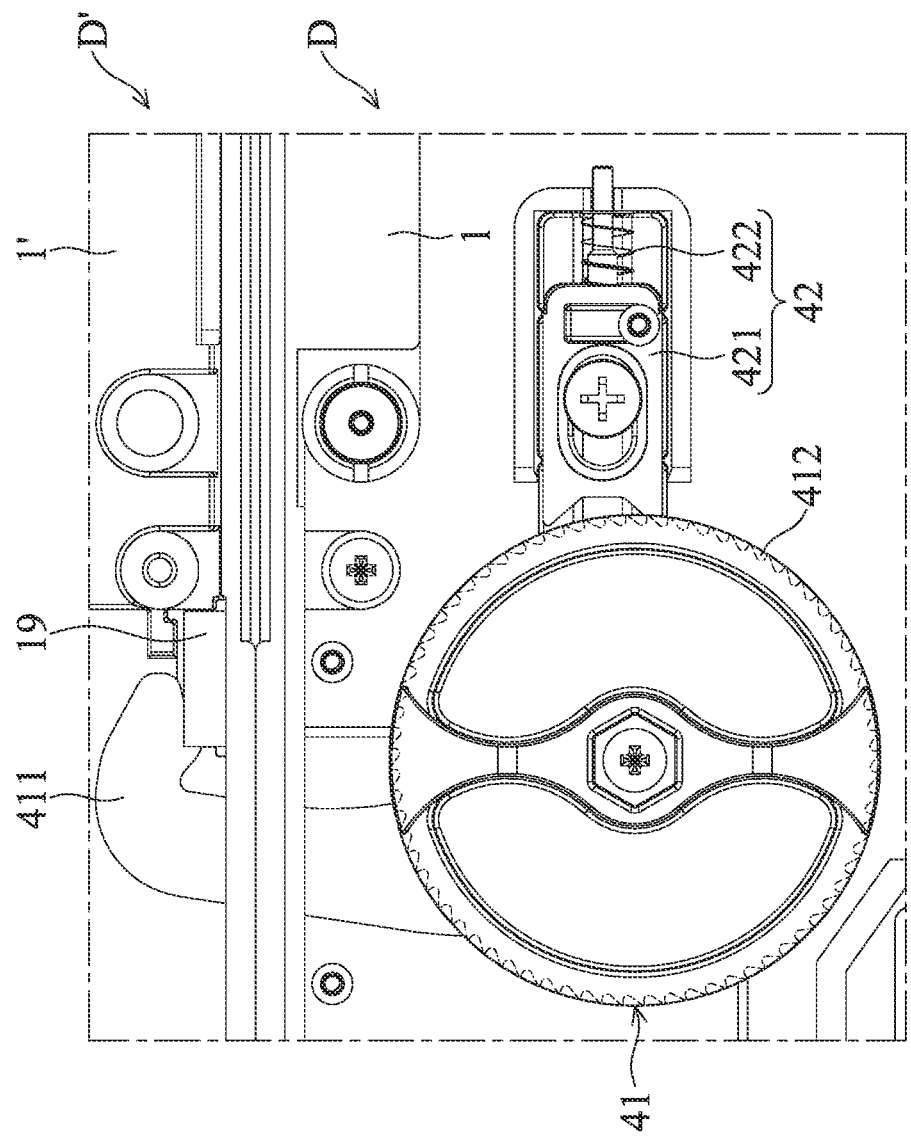
FIG. 3B shows the details of the knob of the embodiment of the invention.

FIG. 3A shows a knob of the embodiment of the invention. FIG. 3B shows the details of the knob of the embodiment of the invention. With reference to FIGS. 3A and 3B, the display device D of the embodiment of the invention further comprises a knob 41 and a restriction unit 42. The knob 41 is rotatably connected to the device housing 1. The knob 41 comprises a latch and a plurality of teeth 412. The knob 41 is adapted to be rotated between a first knob location and a second knob location. When the knob 41 is in the first knob location (FIGS. 3A and 3B), the latch 411 protrudes from the device housing 1. When the knob 41 is in the second knob location, the latch 411 is received in the device housing 1. The restriction unit 42 is disposed in the device housing 1. The restriction unit 42 is adapted to be connected to one of the teeth 412 to restrict the knob 41.

With reference to FIGS. 3A and 3B, in one embodiment, the teeth 412 are ratchet teeth, which provide a non-return function. The disclosure is not meant to restrict the invention. The shape of the teeth 412 can be modified.

With reference to FIGS. 3A and 3B, in one embodiment, the restriction unit 42 comprises a restriction block 421 and a spring 422. One end of the spring 422 abuts the device housing 1. The other end of the spring 422 abuts the restriction block 421. The restriction block is adapted to be moved between a first block position and a second block position. When the restriction block 421 is in the first block position (FIGS. 3A and 3B), the restriction block 421 is wedged against at least one of the teeth 412 to provide the non-return function. When the restriction block 421 is in the second block position, the restriction block 421 releases the knob 41.

With reference to FIG. 3B, in one embodiment, the latch 411 is adapted to be connected to the device housing 1' of another display device D'. The display device D' comprises a rubber gasket 19. The latch 411 abuts the rubber gasket 19.

Figure 4A:
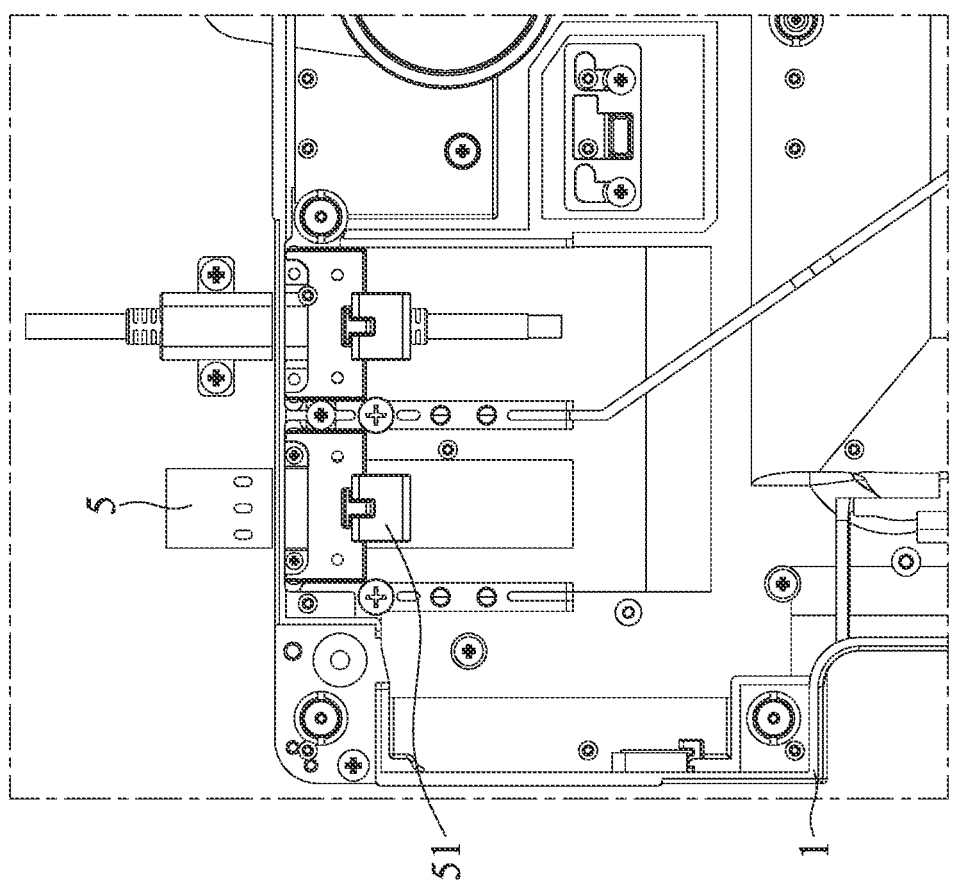
FIGS. 4A and 4B show a first connector of the display device of the embodiment of the invention.
Figure 4B:
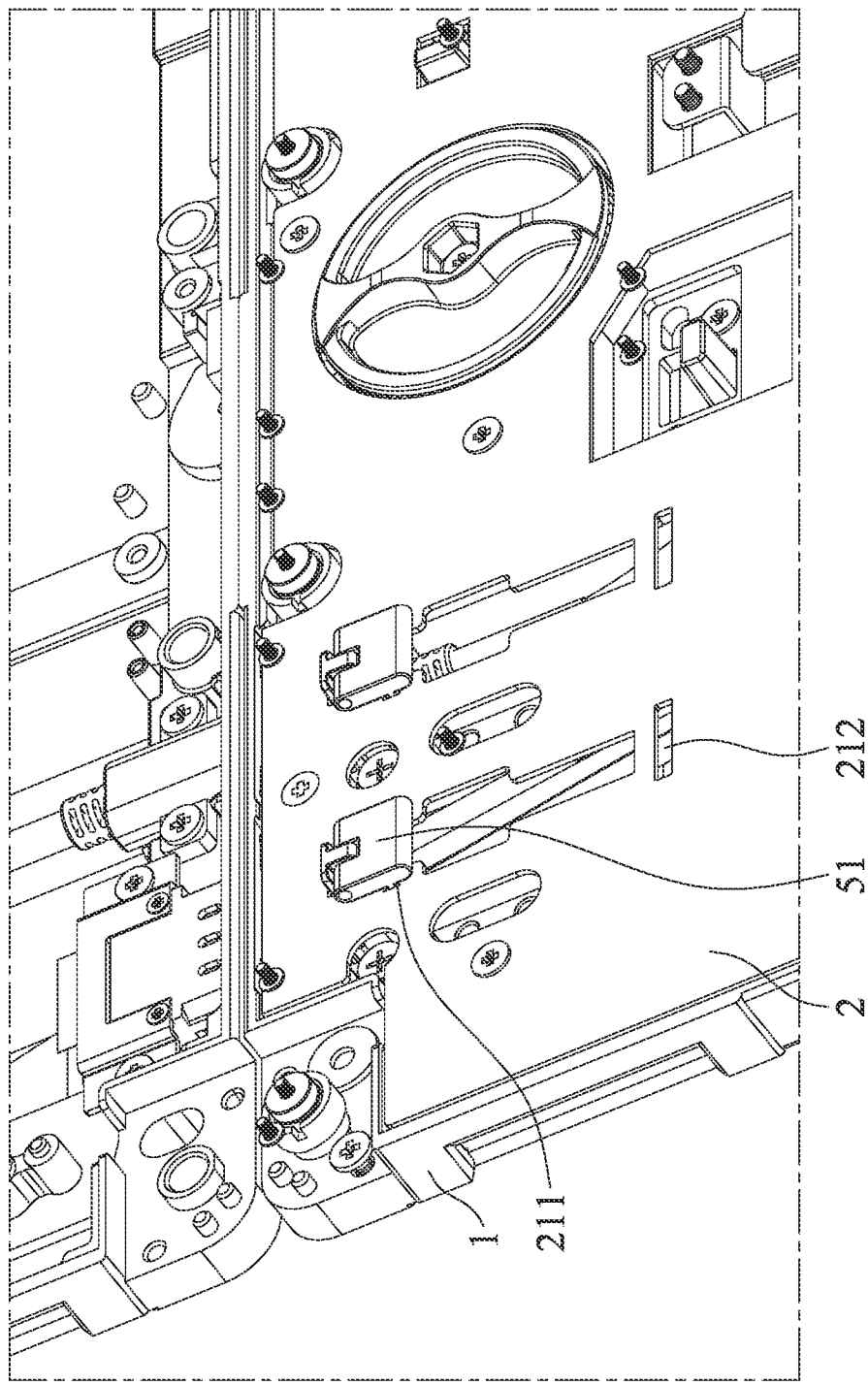

FIGS. 4A and 4B show a first connector of the display device of the embodiment of the invention. With reference to FIGS. 4A and 4B, in one embodiment, the display device D further comprises a first connector 5. The first connector 5 is slidably connected to the device housing 1. The first connector 5 is adapted to be moved between a first connector position and a second connector position. When the first connector 5 is in the first connector position (FIGS. 4A and 4B), the first connector 5 protrudes from the device housing 1. When the first connector 5 is in the second connector position, the first connector 5 is received in the device housing 1.

With reference to FIGS. 4A and 4B, in one embodiment, the first connector 5 can be a power connector or a USB connector.

With reference to FIGS. 4A and 4B, in one embodiment, the display device further comprises a locking member 51. The locking member 51 pivots on the first connector 5. In a first locking state, the locking member 51 is connected to the cover piece 2 to restrict the movement of the first connector 5 relative to the device housing 1.

With reference to FIGS. 4A and 4B, in one embodiment, the cover piece 2 comprises a first slot 211 and a second slot 212. When the first connector 5 is in the first connector position, the locking member 51 is adapted to be connected to the first slot 211. When the first connector is in the second connector position, the locking member 51 is adapted to be connected to the second slot 212.

Figure 5A:
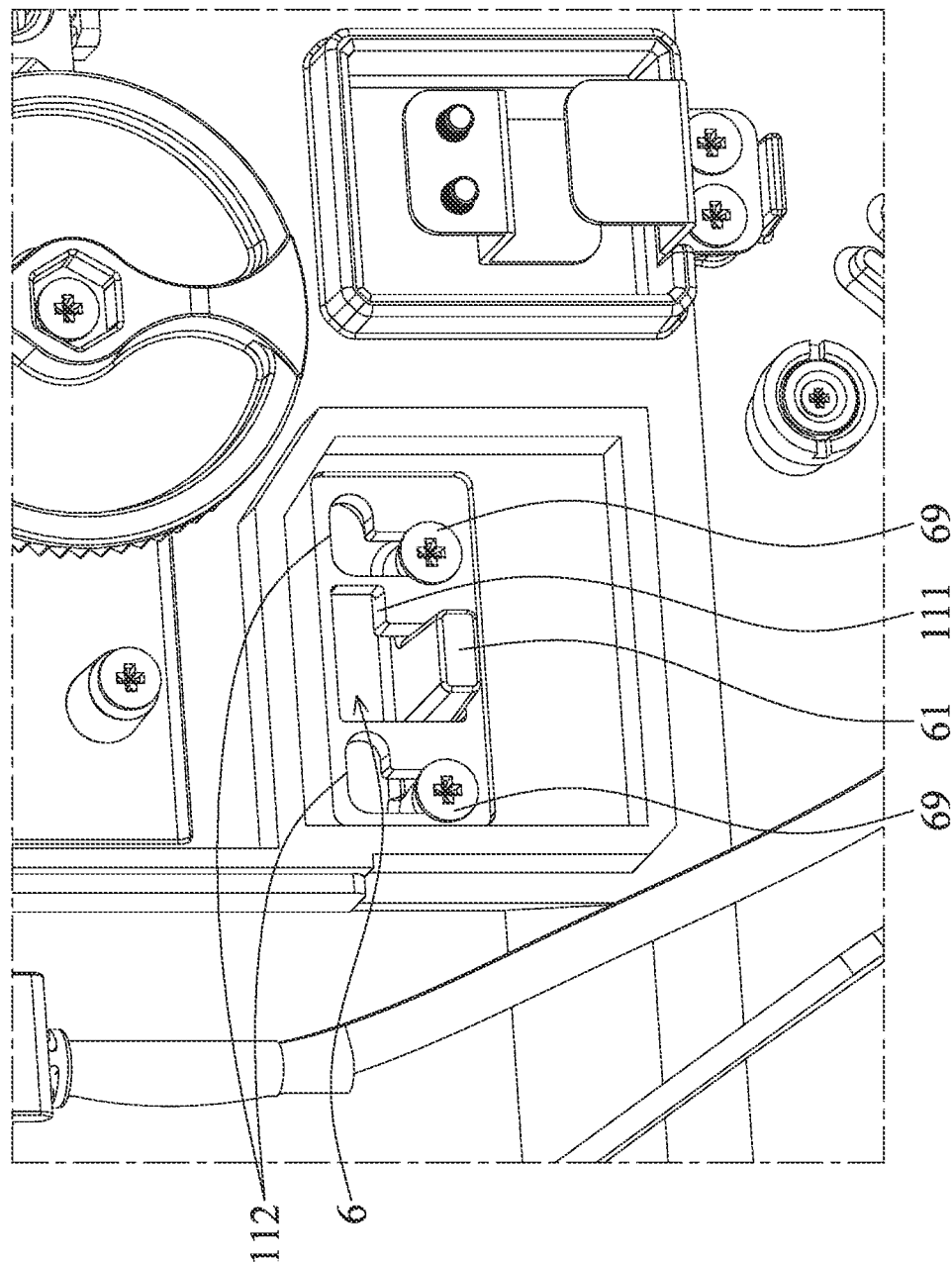
FIGS. 5A and 5B show a hook of the embodiment of the invention.
Figure 5B:
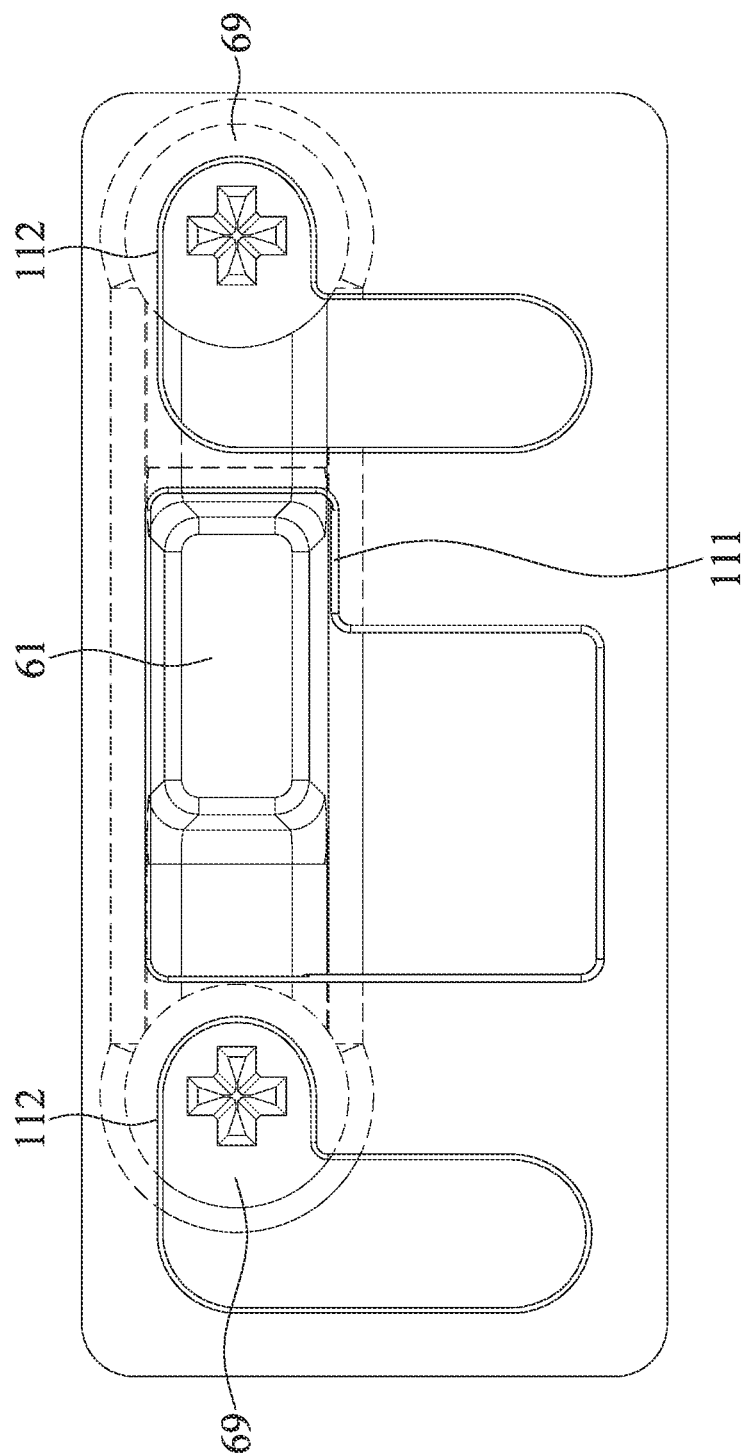

FIGS. 5A and 5B show a hook of the embodiment of the invention. With reference to FIGS. 5A and 5B, in one embodiment, the display device further comprises a hook 6 and two bolts 69. The hook 6 comprises a holding portion 61. The device 1 comprises a first L-shaped groove 111 and two second L-shaped grooves 112. The bolts 69 pass through the second L-shaped grooves 112 to connect the hook 6 to the device housing 1. The holding portion 61 passes through the first L-shaped groove 111.

With reference to FIGS. 5A and 5B, in one embodiment, in an affixed state, the bolts are affixed to fasten the position of the hook 6 relative to the device housing 1. In a released state, the bolts 69 are released and adapted to be moved along the second L-shaped grooves 112, and the holding portion 61 is adapted to be moved along the first L-shaped groove 111.

Figure 5C:
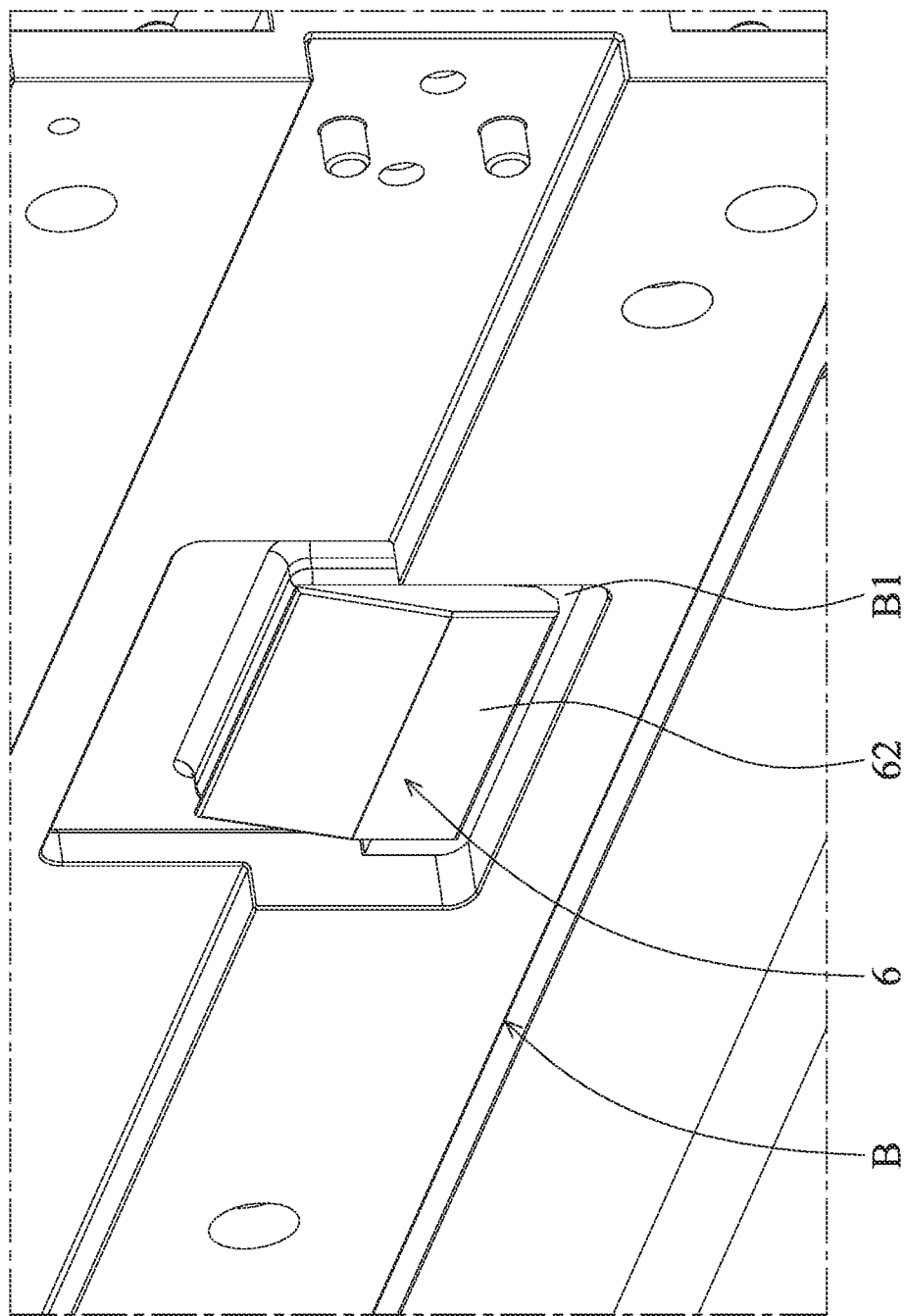
FIG. 5C shows the hook of the embodiment of the invention connected to the bracket.

FIG. 5C shows the hook of the embodiment of the invention connected to the bracket. With reference to FIG. 5C, the hook 6 comprises a hook connecting portion 62. The hook 6 is hung on the bracket B via the hook connecting portion 62. Particularly, the bracket B comprises a bracket connecting portion B1. The hook connecting portion 62 is connected to the bracket connecting portion B1. In the released state, the hook 6 can be moved, and the hook connecting portion 62 is separated from the bracket connecting portion B1.

Figure 6A:
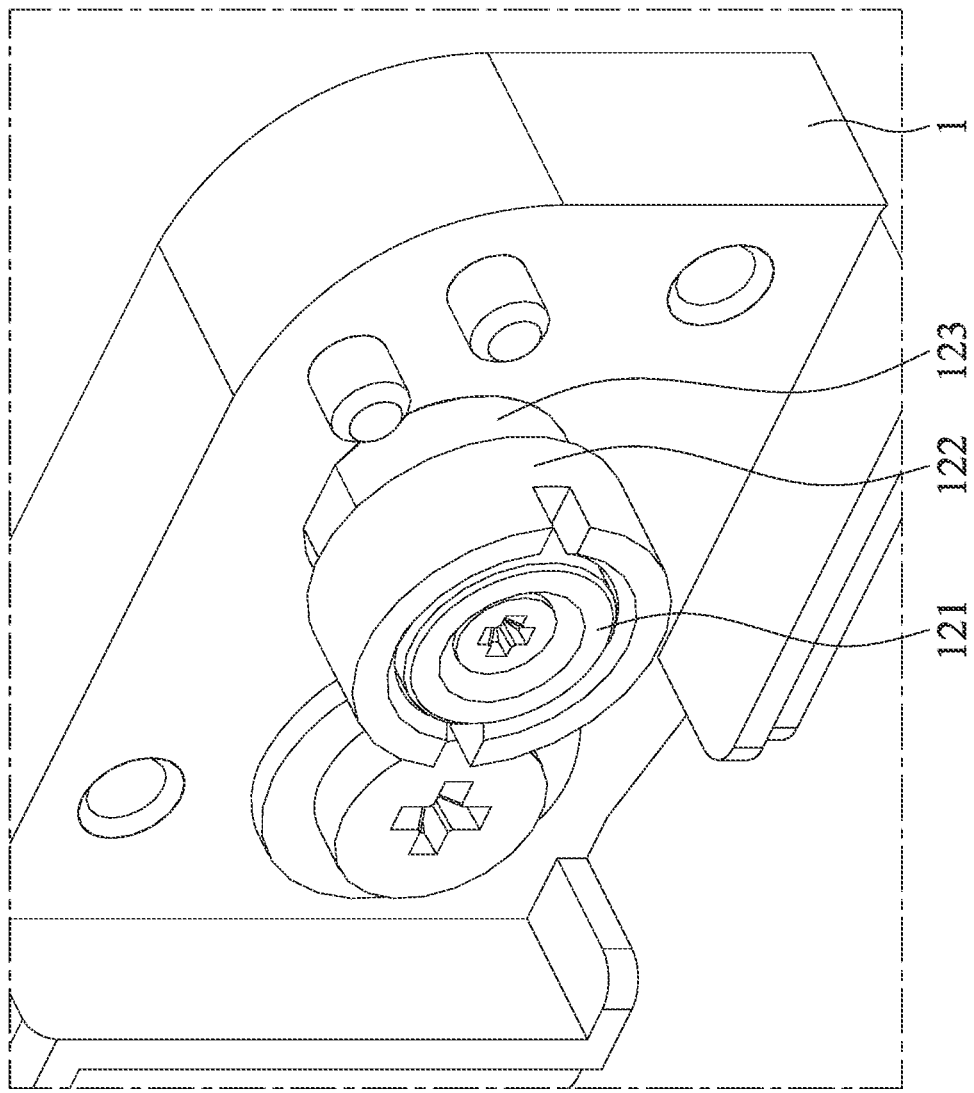
FIGS. 6A and 6B show fine-tuning screws of the embodiment of the invention.
Figure 6B:
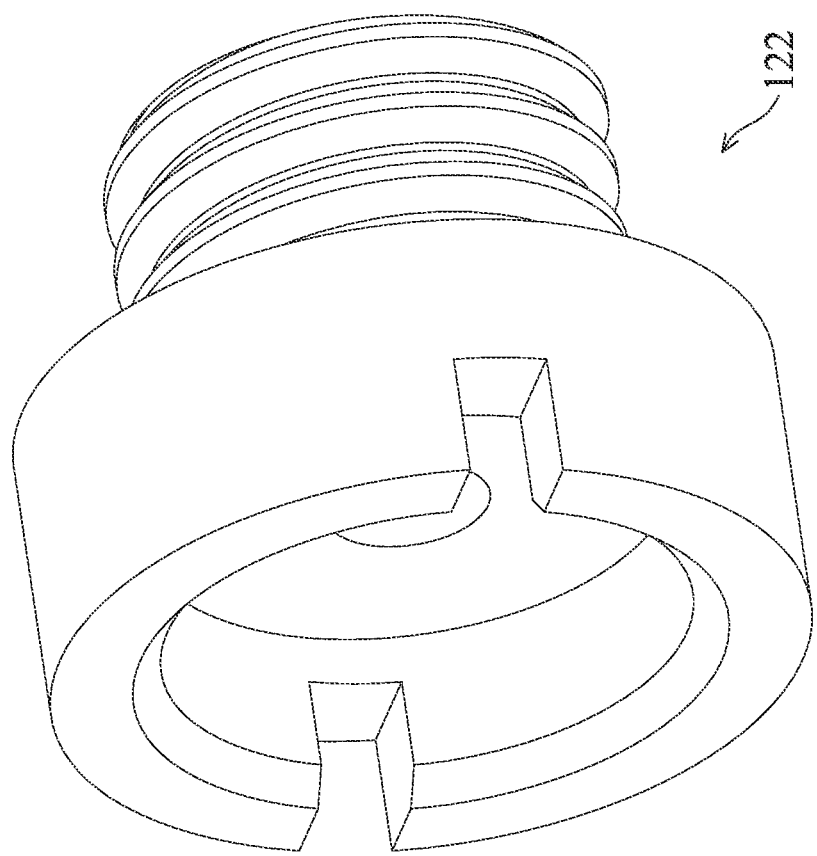
Figure 6C:
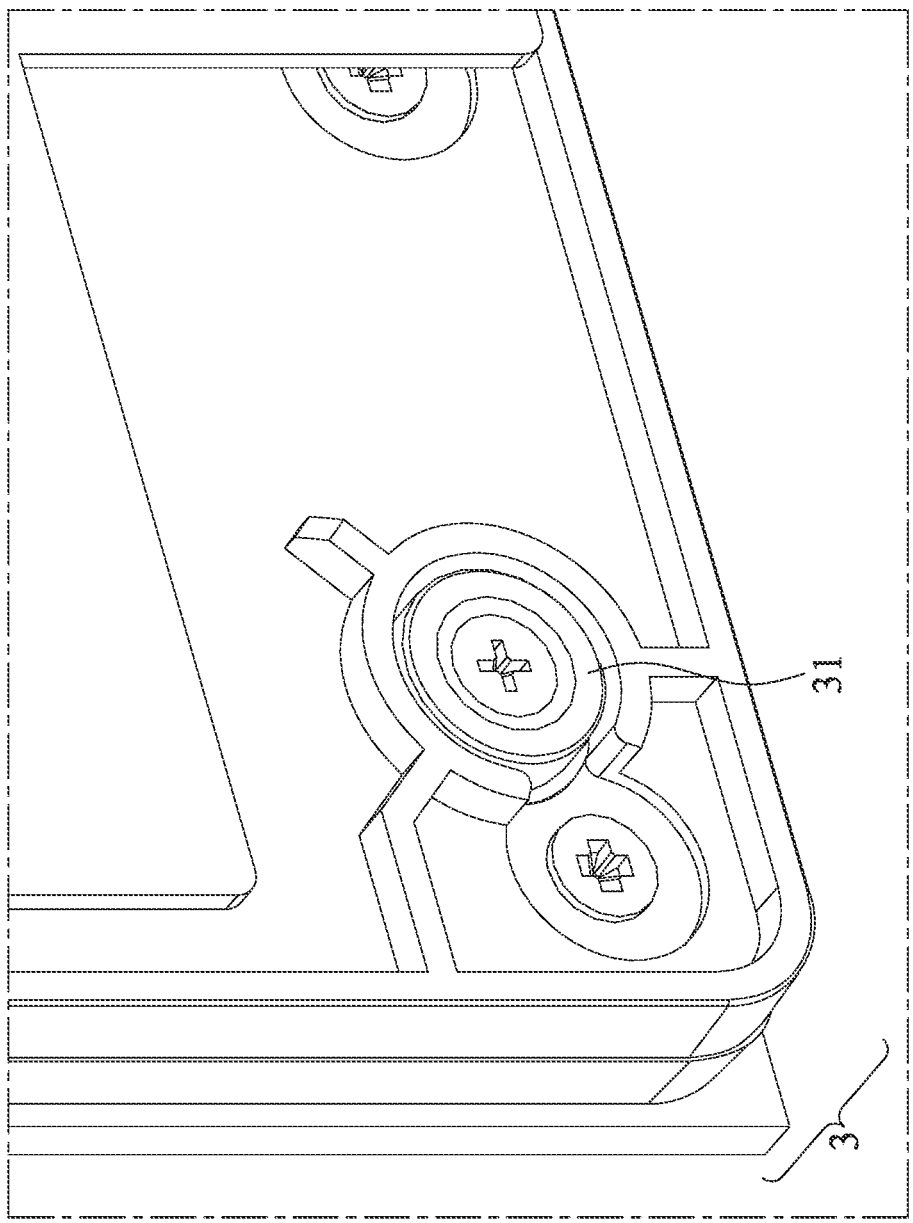
FIG. 6C shows a panel magnet of the embodiment of the invention.

FIGS. 6A and 6B show fine-tuning screws of the embodiment of the invention. FIG. 6C shows a panel magnet of the embodiment of the invention. With reference to FIGS. 6A, 6B and 6C, in one embodiment, the display device further comprises a plurality of panel magnets 31 and a plurality of connection magnets 121. The panel magnets 31 are disposed on the screen panel 3. The connection magnets 121 are disposed on the device housing 1. The panel magnets 31 are adapted to be attracted by the connection magnets 121, and the screen panel 3 is thus detachably connected to the device housing 1.

With reference to FIGS. 6A, 6B and 6C, in one embodiment, the display device further comprises a plurality of fine-tuning screws 122. The device housing further comprises a plurality of screw holders 123. The fine-tuning screws 122 are connected to the screw holders 123. The connection magnets 121 are disposed on the fine-tuning screws 122. The position of the connection magnets 121 relative to the device housing 1 can be modified by rotating the fine-tuning screws 122.

Figure 7A:
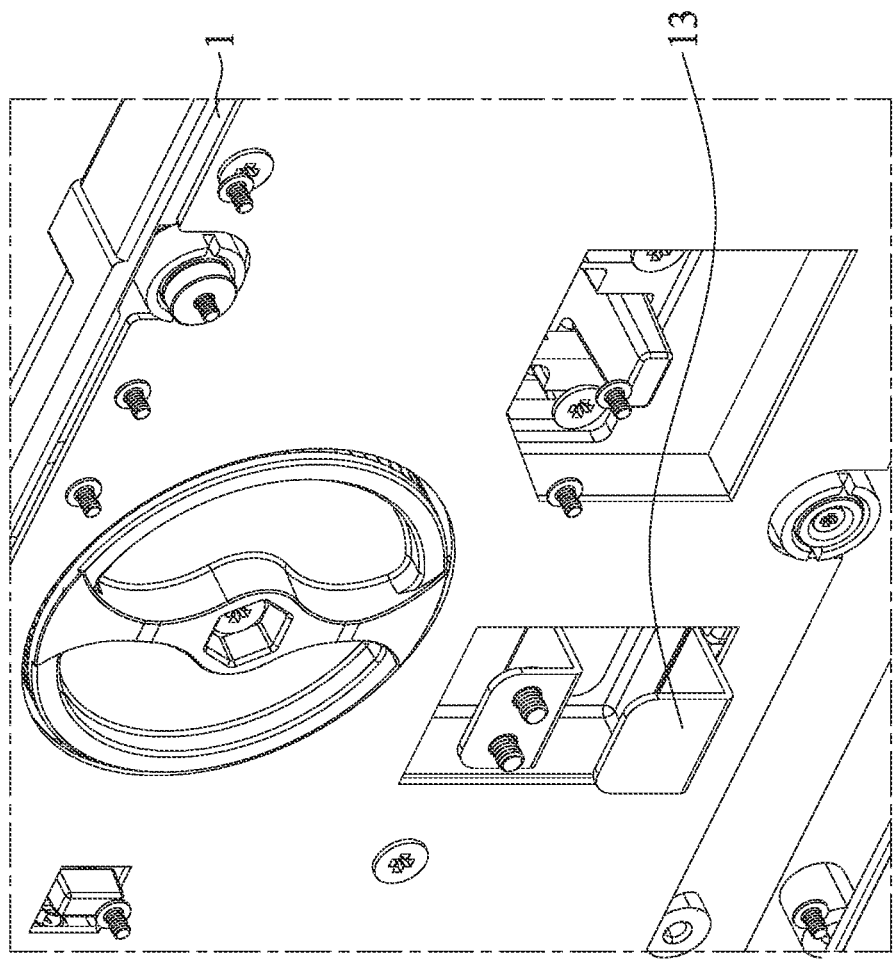
FIGS. 7A and 7B show a panel buckling portion and a housing buckling portion of the embodiment of the invention.
Figure 7B:
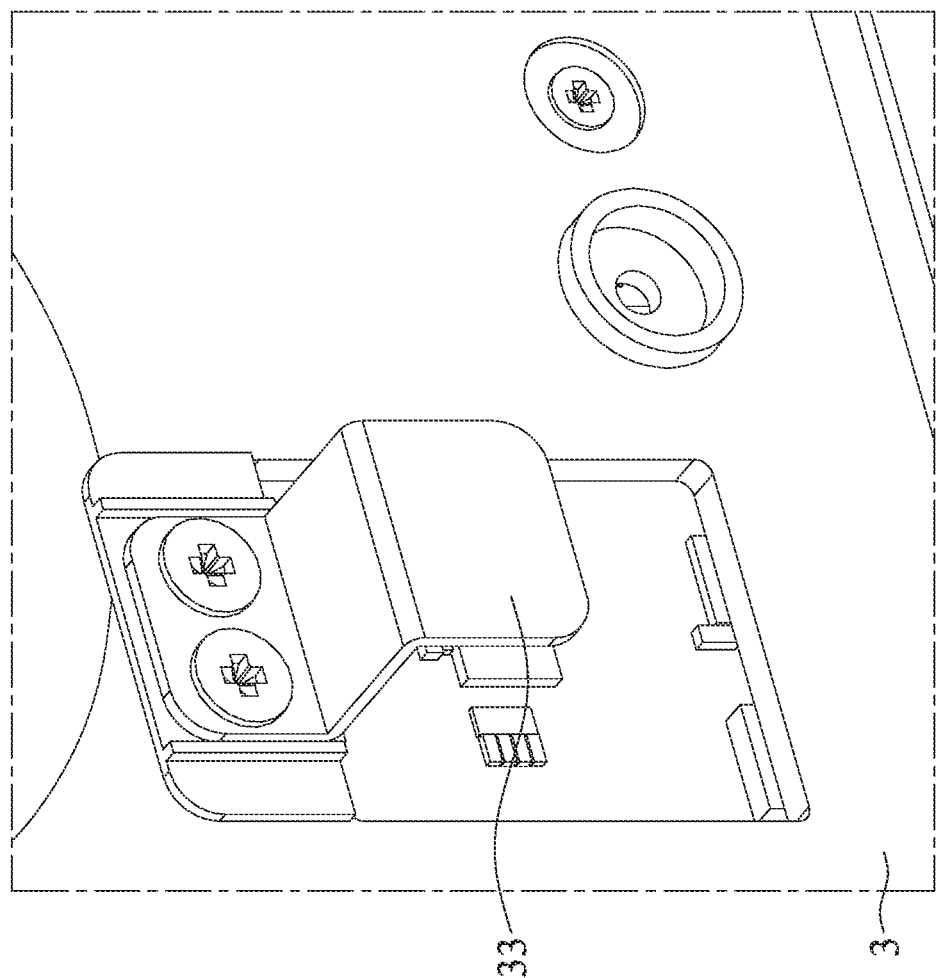

FIGS. 7A and 7B show a panel buckling portion and a housing buckling portion of the embodiment of the invention. With reference to FIGS. 7A and 7B, in one embodiment, the screen panel 3 comprises at least one panel buckling portion 33. The device housing 1 comprises at least one housing buckling portion 13. In an unexpected state, the housing buckling portion is adapted to connect to the panel buckling portion 33 to support the screen panel 3.

Figure 8A:
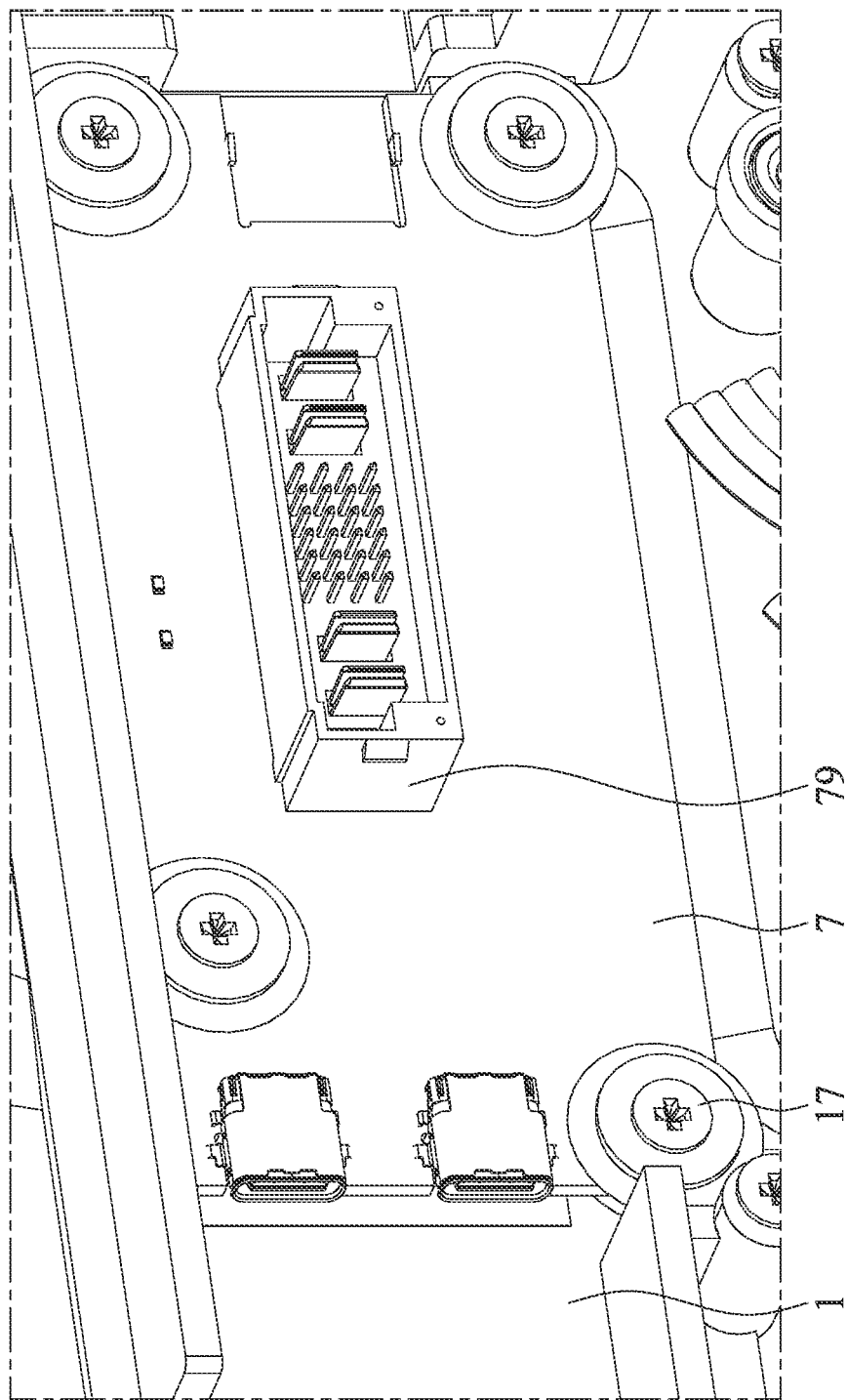
FIGS. 8A and 8B show a riser card of the embodiment of the invention.
Figure 8B:
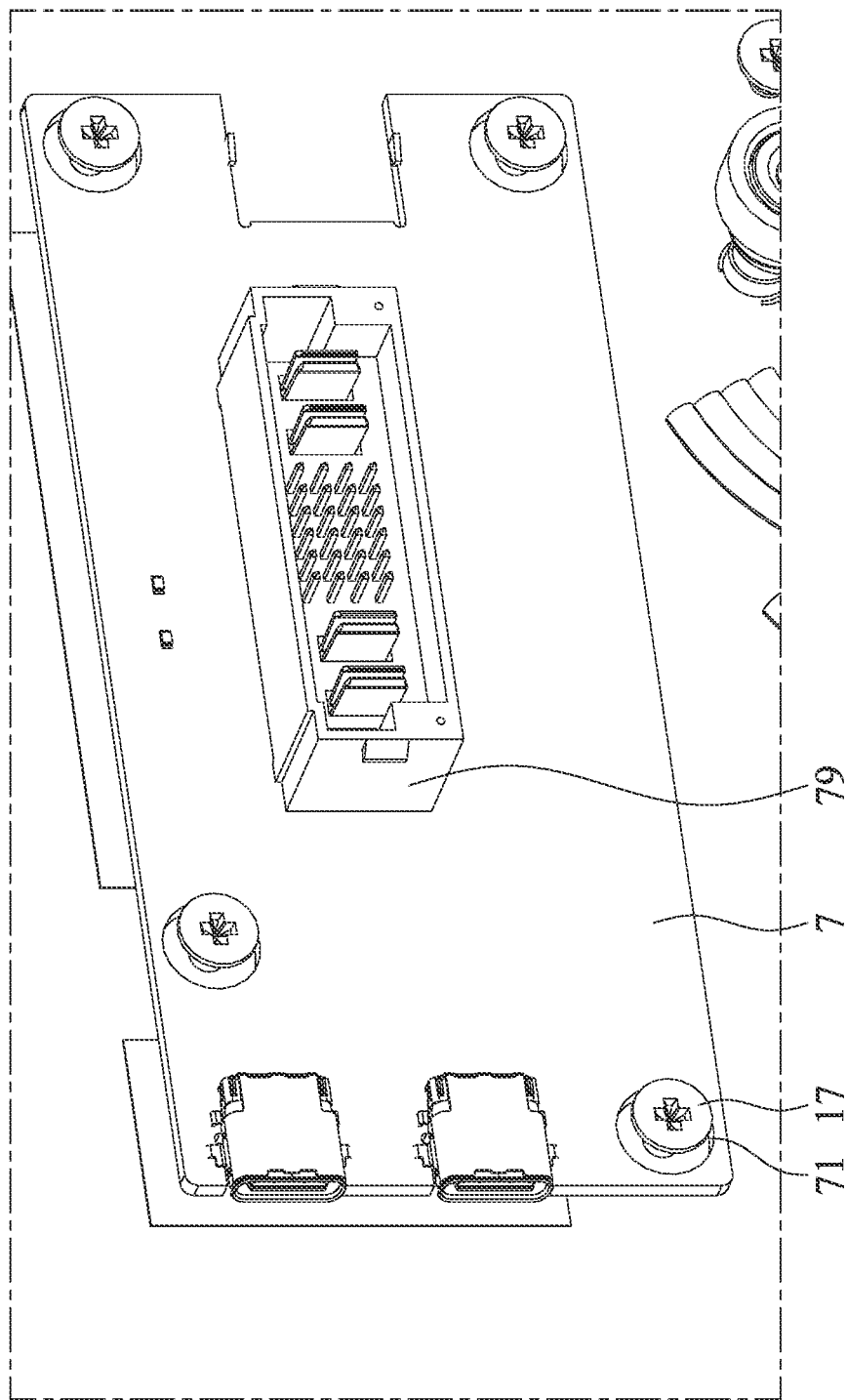

FIGS. 8A and 8B show a riser card of the embodiment of the invention. With reference to FIGS. 8A and 8B, in one embodiment, the display device further comprises a riser card 7 and a second connector 79. The riser card 7 is slidably connected to the device housing 1. The second connector 79 is disposed on the riser card 7. The second connector 79 is adapted to be connected to the screen panel 3. The riser card 7 comprises a plurality of openings 71. A gap is formed between the inner wall of the opening 71 and a screw 17. The riser card 7 thus can be slid relative to the device housing 1 to prevent the second connector 79 being damaged during the screen panel 3 being detached.

Utilizing the display device of the embodiment of the invention, when one of the display devices of the display system T is damaged, the maintainer can detach the damaged display device through the following steps. With reference to FIGS. 1, 3A, 4A and 5A, first, the screen panel 3 is removed from the device housing 1. Then, the bolts 69 on the hook 6 are released. The hook 9 is pushed to be separated from the bracket B. Next, the first connector 5 is pushed to the second connector position, and the knob 41 is rotated to the second knob location. Finally, the device housing 1 can be detached directly. Compared to the conventional art, the display devices of the embodiment of the invention can be easily assembled and disassembled. Particularly, when the damaged display device is located in the center portion of the display system T, the damaged display device can be detached without removing the non-damaged display devices in the same column or the same row. The maintenance procedure is simplified. Additionally, the knob 41 can tightly and seamlessly connect the two adjacent display devices.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover piece various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
   a device housing;
   a knob, rotatably connected to the device housing, wherein the knob comprises a latch and a plurality of teeth, the knob is adapted to be rotated between a first knob location and a second knob location around an axis, and when the knob is in the first knob location, the latch protrudes from the device housing, and when the knob is in the second knob location, the latch is located in the device housing;

a restriction unit, disposed in the device housing, wherein the restriction unit is adapted to be connected to one of the plurality of teeth to restrict the knob; and a screen panel, detachably connected to the device housing, wherein the axis is perpendicular to the screen panel, wherein the restriction unit comprises a restriction block and a spring, one end of the spring abuts the device housing, the other end of the spring abuts the restriction block, the restriction block is adapted to be moved between a first block position and a second block position along a straight line parallel to the screen panel.

2. The display device as claimed in claim 1, wherein the plurality of teeth are plurality of ratchet teeth.

3. The display device as claimed in claim 1, wherein when the restriction block is in the first block position, the restriction block is wedged against at least one of the teeth, and when the restriction block is in the second block position, the restriction block releases the knob.

4. The display device as claimed in claim 1, further comprising a first connector, wherein the first connector is slidably connected to the device housing, the first connector is adapted to be moved between a first connector position and a second connector position, and when the first connector is in the first connector position, the first connector protrudes from the device housing, and when the first connector is in the second connector position, the first connector is located in the device housing.

5. The display device as claimed in claim 4, further comprising a locking member and a cover piece, wherein the cover piece is connected to the device housing, the locking member pivots on the first connecter, and in a first locking state, the locking member is connected to the cover piece to restrict movement of the first connector relative to the device housing.

6. The display device as claimed in claim 5, wherein the cover piece comprises a first slot and a second slot, and when the first connector is in the first connector position, the locking member is adapted to be connected to the first slot, and when the first connector is in the second connector position, the locking member is adapted to be connected to the second slot.

7. The display device as claimed in claim 1, further comprising a hook and two bolts, wherein the hook comprises a holding portion, the device comprises a first L-shaped groove and two second L-shaped grooves, the bolts pass through the second L-shaped grooves to connect the hook to the device housing, and the holding portion passes through the first L-shaped groove.

8. The display device as claimed in claim 7, wherein in an affixed state, the bolts affix the position of the hook relative to the device housing, and in a released state, the bolts are adapted to be moved along the second L-shaped grooves, and the holding portion is adapted to be moved along the first L-shaped groove.

9. The display device as claimed in claim 1, further comprising a plurality of panel magnets and a plurality of connection magnets, wherein the plurality of panel magnets are disposed on the screen panel, the plurality of connection magnets are disposed on the device housing, the plurality of panel magnets are adapted to be attracted by the plurality of connection magnets separately, and the screen panel is detachably connected to the device housing.

10. The display device as claimed in claim 9, further comprising a plurality of fine-tuning screws, wherein the device housing further comprises a plurality of screw holders, the plurality of fine-tuning screws are separately connected to the plurality of screw holders, the plurality of connection magnets are separately disposed on the plurality of fine-tuning screws, and the position of the plurality of connection magnets is modified relative to the device housing by rotating the fine-tuning screws.

11. The display device as claimed in claim 9, wherein the screen panel comprises at least one panel buckling portion, the device housing comprises at least one housing buckling portion, and the housing buckling portion is adapted to connect to the panel buckling portion to support the screen panel.

12. The display device as claimed in claim 9, further comprising a riser card and a second connector, wherein the riser card is slidably connected to the device housing, the second connector is disposed on the riser card, and the second connector is adapted to be connected to the screen panel.

13. A display system, comprising:

at least one bracket;

a plurality of display devices, hung on the at least one bracket, wherein each display device comprises:

a device housing;

a knob, rotatably connected to the device housing, wherein the knob comprises a latch and a plurality of teeth, the knob is adapted to be rotated between a first knob location and a second knob location around an axis, and when the knob is in the first knob location, the latch protrudes from the device housing, and when the knob is in the second knob location, the latch is located in the device housing;

a restriction unit, disposed in the device housing, wherein the restriction unit is adapted to be connected to one of the plurality of teeth to restrict the knob; and a screen panel, detachably connected to the device housing, wherein the axis is perpendicular to the screen panel, wherein the knob is adapted to connect the adjacent two display devices, wherein the restriction unit comprises a restriction block and a spring, one end of the spring abuts the device housing, the other end of the spring abuts the restriction block, the restriction block is adapted to be moved between a first block position and a second block position along a straight line parallel to the screen panel.

14. The display system as claimed in claim 13, wherein when the restriction block is in the first block position, the restriction block is wedged against at least one of the teeth, and when the restriction block is in the second block position, the restriction block releases the knob.

15. The display system as claimed in claim 13, wherein each display device further comprises a first connector, the first connector is slidably connected to the device housing, the first connector is adapted to be moved between a first connector position and a second connector position, and when the first connector is in the first connector position, the first connector protrudes from the device housing, and when the first connector is in the second connector position, the first connector is located in the device housing.

16. The display system as claimed in claim 15, wherein each display device further comprises a locking member and a cover piece, the cover piece is connected to the device housing, the locking member pivots on the first connecter, and in a first locking state, the locking member is connected to the cover piece to restrict the movement of the first connector relative to the device housing.

17. The display system as claimed in claim 16, wherein the cover piece comprises a first slot and a second slot, and when the first connector is in the first connector position, the locking member is adapted to be connected to the first slot, and when the first connector is in the second connector position, the locking member is adapted to be connected to the second slot.

18. The display system as claimed in claim 13, wherein each display device further comprises a hook and two bolts, the hook comprises a holding portion, the device comprises a first L-shaped groove and two second L-shaped grooves, the bolts pass through the second L-shaped grooves to connect the hook to the device housing, and the holding portion passes through the first L-shaped groove.

19. A display connection module, comprising:
   a device housing;
   a knob, rotatably connected to the device housing, wherein the knob comprises a latch and a plurality of teeth, the knob is adapted to be rotated between a first knob location and a second knob location, and when the knob is in the first knob location, the latch protrudes from the device housing, and when the knob is in the second knob location, the latch is located in the device housing;
   a restriction unit, disposed in the device housing, wherein the restriction unit is adapted to be connected to one of the plurality of teeth to restrict the knob; and
   a first connector, wherein the first connector is slidably connected to the device housing, the first connector is adapted to be moved between a first connector position and a second connector position, and when the first connector is in the first connector position, the first connector protrudes from the device housing, and when the first connector is in the second connector position, the first connector is located in the device housing.

\* \* \* \* \*